(12) United States Patent
Kang et al.

(10) Patent No.: US 9,875,796 B2
(45) Date of Patent: Jan. 23, 2018

(54) RESISTIVE MEMORY DEVICE AND METHOD RELATING TO A READ VOLTAGE IN ACCORDANCE WITH VARIABLE SITUATIONS

(71) Applicant: SK hynix Inc., Icheon-si, Gyeonggi-do (KR)

(72) Inventors: Seok Joon Kang, Icheon-si (KR); Ho Seok Em, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/215,815

(22) Filed: Jul. 21, 2016

(65) Prior Publication Data

US 2017/0243639 A1    Aug. 24, 2017

(30) Foreign Application Priority Data

Feb. 18, 2016    (KR) ........................ 10-2016-0019060

(51) Int. Cl.
| | | |
|---|---|---|
| *G11C 11/00* | (2006.01) | |
| *G11C 13/00* | (2006.01) | |
| *G01K 13/00* | (2006.01) | |

(52) U.S. Cl.
CPC ............ *G11C 13/004* (2013.01); *G01K 13/00* (2013.01); *G11C 13/0069* (2013.01); *G11C 13/0097* (2013.01); *G11C 2013/0054* (2013.01)

(58) Field of Classification Search
None
See application file for complete search history.

(56) References Cited

U.S. PATENT DOCUMENTS

| 2006/0157679 A1* | 7/2006 | Scheuerlein | ....... G11C 13/0004 257/2 |
| 2012/0075923 A1* | 3/2012 | Thiruvengadam | . G11C 13/0004 365/163 |
| 2013/0265837 A1* | 10/2013 | Kwon | ...................... G11C 7/22 365/194 |
| 2014/0063904 A1* | 3/2014 | Yon | ....................... G11C 13/004 365/148 |

(Continued)

FOREIGN PATENT DOCUMENTS

| KR | 1020150089670 A | 8/2015 |
| KR | 1020150120213 A | 10/2015 |
| KR | 1020150121562 A | 10/2015 |

*Primary Examiner* — Uyen B Tran
(74) *Attorney, Agent, or Firm* — William Park & Associates Ltd.

(57) ABSTRACT

A resistive memory device and a method may be provided. The resistive memory device may include a reset voltage-detecting circuit, a set voltage-detecting circuit, a control circuit and a read voltage-generating circuit. The reset voltage-detecting circuit may receive a variable preliminary reset current to detect reference reset voltage information. The set voltage-detecting circuit may receive a variable preliminary set current to detect reference set voltage information. The control circuit may receive the reference reset voltage information and the reference set voltage information to determine middle voltage information of the reference reset voltage information and the reference set voltage information. The read voltage-generating circuit may receive the middle voltage information to generate a read voltage.

13 Claims, 9 Drawing Sheets

(56) References Cited

U.S. PATENT DOCUMENTS

2014/0184534 A1* 7/2014 Lee ............... G06F 3/0412
 345/173
2015/0325289 A1* 11/2015 Castro ............ G11C 13/0004
 365/148

* cited by examiner

RESISTIVE MEMORY DEVICE AND METHOD RELATING TO A READ VOLTAGE IN ACCORDANCE WITH VARIABLE SITUATIONS

CROSS-REFERENCES TO RELATED APPLICATION

The present application claims priority under 35 U.S.C. § 119(a) to Korean application number 10-2016-0019060, filed on Feb. 18, 2016, in the Korean Intellectual Property Office, which is incorporated herein by reference in its entirety.

BACKGROUND

1. Technical Field

Various embodiments may generally relate to a resistive memory device and method, more particularly, to a resistive memory device relating to a read voltage in accordance with variable situations.

2. Related Art

A memory device may be used as a semiconductor integrated circuit of a computer or other electronic devices. The memory device may include a RAM device, a ROM device, a DRAM device, an SDRAM device, a flash memory device, and/or a resistance-changeable memory device.

The resistance-changeable memory device may differentiate data using resistive changes of a storage element. The resistive memory device may include a programmable conductive memory device, a resistive memory device (ReRAM), and/or a phase-changeable memory device (PCRAM), etc.

According to related arts, the resistive memory device may not accurately differentiate the data due to a wide distribution range of the resistances. Changes of the resistances may be caused by a disturbance of an adjacent cell, a temperature change due to a long time use of a cell, and/or wearing due to repeated read/write operations, etc. The changes of the resistances may cause difficulties in reading reliable data from the resistive memory device.

SUMMARY

According to an embodiment, there may be provided a resistive memory device and method. The resistive memory device may include a reset voltage-detecting circuit, a set voltage-detecting circuit, a control circuit and a read voltage-generating circuit. The reset voltage-detecting circuit may receive a variable preliminary reset current to detect reference reset voltage information. The set voltage-detecting circuit may receive a variable preliminary set current to detect reference set voltage information. The control circuit may receive the reference reset voltage information and the reference set voltage information to determine middle voltage information of the reference reset voltage information and the reference set voltage information. The read voltage-generating circuit may receive the middle voltage information to generate a read voltage.

DETAILED DESCRIPTION

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

Figure 1:
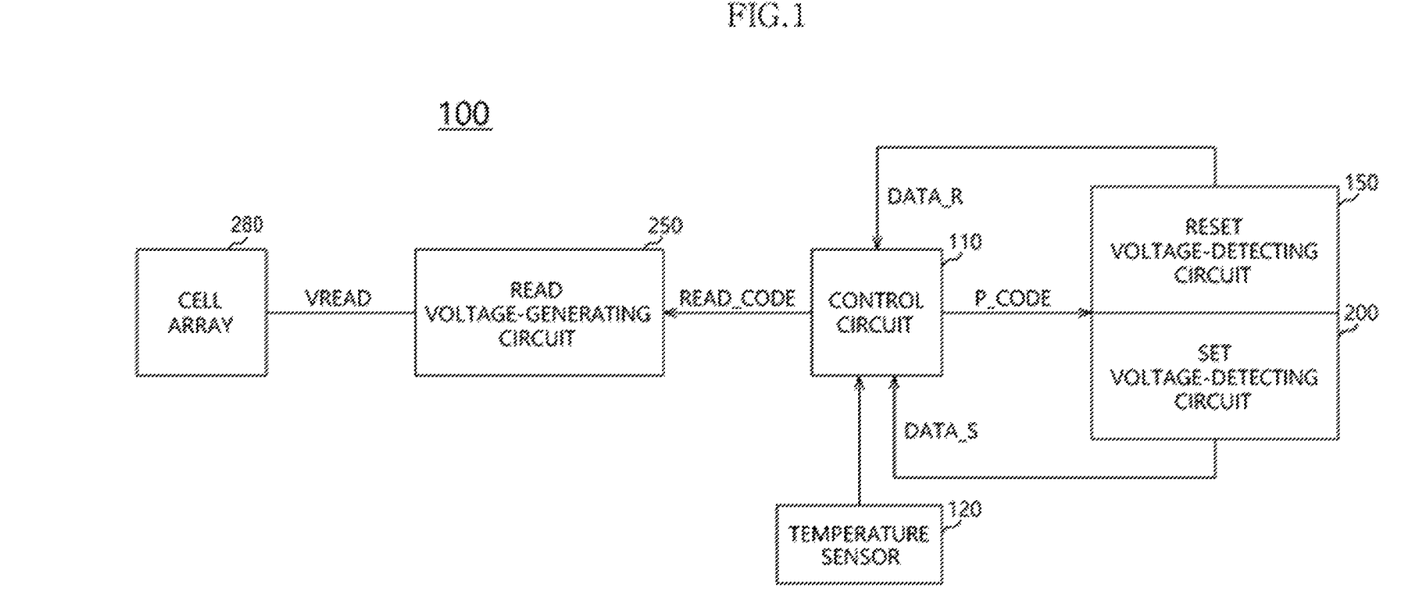
FIG. 1 is a block diagram illustrating a representation of an example of a resistive memory device in accordance with an embodiment.

Referring to FIG. 1, a resistive memory device 100 of an example of an embodiment may include a control circuit 110, a reset voltage-detecting circuit 150, a set voltage-detecting circuit 200 and a read voltage-generating circuit 250.

The control circuit 110 may provide the reset voltage-detecting circuit 150 and the set voltage-detecting circuit 200 with a preliminary target code P_CODE. The preliminary target code P_CODE may include a predetermined set value or arbitrarily set value based on a temperature sensed by a temperature sensor 120. The control circuit 110 may receive data Data_R and Data_S corresponding to reference reset voltage information and reference set voltage information from the reset voltage-detecting circuit 150 and the set voltage-detecting circuit 200. The control circuit 110 may provide the read voltage-generating circuit 250 with a middle value of the data Data_R and Data_S. For example, the control circuit 110 may code the data Data_R and Data_S to generate data codes, as a read voltage code READ_CODE. The control circuit 110 may provide the read voltage-generating circuit 250 with a middle code of the data codes.

The reset voltage-detecting circuit 150 may provide a reference cell with a preliminary reset current corresponding to the preliminary target code P_CODE provided from the control circuit 110. The reset voltage-detecting circuit 150 may detect an output current from the reference cell to which a write operation may be performed by the preliminary reset current. The reset voltage-detecting circuit 150 may detect a maximum critical reset current at which a snapback may not be generated. The reset voltage-detecting circuit 150 may detect the reference reset voltage information corresponding to the critical reset current. The reset voltage-detecting circuit 150 may provide the control circuit 110 with the reference reset voltage information as the digital code data Data_R.

Configurations and operations of a reset voltage-detecting circuit 150 may be illustrated with reference to FIGS. 2 to 5.

Figure 2:
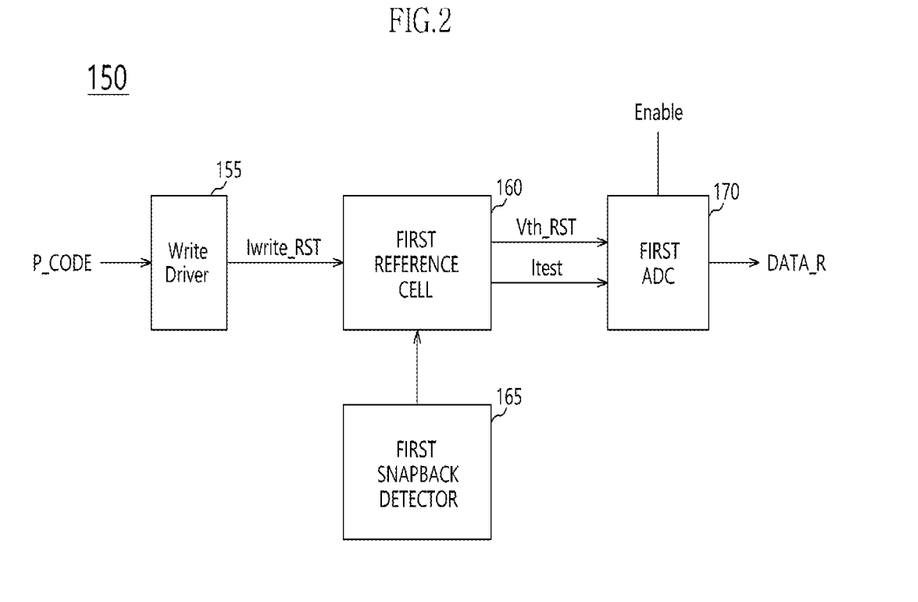
FIG. 2 is a block diagram illustrating a representation of an example of a reset voltage-detecting circuit in accordance with an embodiment.

Referring to FIG. 2, the reset voltage-detecting circuit 150 may include a write driver 155, a first reference cell 160, a first snapback detector 165 and a first analog digital converter (ADC) 170.

The write driver 155 may generate a preliminary reset current Iwrite_RST corresponding to the preliminary target code P_CODE provided from the control circuit 110. The preliminary target code P_CODE may include the initially determined reset voltage information. The write driver 155 may generate the preliminary reset current Iwrite_RST corresponding to the initially determined reset voltage information. The initially determined reset voltage information may include information set by the temperature sensor 120. The preliminary reset current Iwrite_RST may be provided to the first reference cell 160.

The write driver 155 may vary the preliminary reset current Iwrite_RST until the first snapback detector 165 may detect a snapback current point. The write driver 155 may provide the first reference cell 160 with the variable preliminary reset current Iwrite_RST. In order to accurately detect the snapback current, the preliminary reset current Iwrite_RST may have a narrow variable range.

The first reference cell 160 may have an environment and a structure substantially the same as those of a cell array in the resistive memory device. For example, the first reference cell 160 may have a cross point structure, a structure including one switching element and one resistive element or a stack type multi-level cell structure. The above-mentioned structures may include a variable resistance in accordance with a current. That is, the preliminary reset current Iwrite_RST may flow through the resistance of the first reference cell 160 so that a critical reset voltage may be detected using a voltage on the resistance and a test current Itest passing through the resistance.

Figure 3:
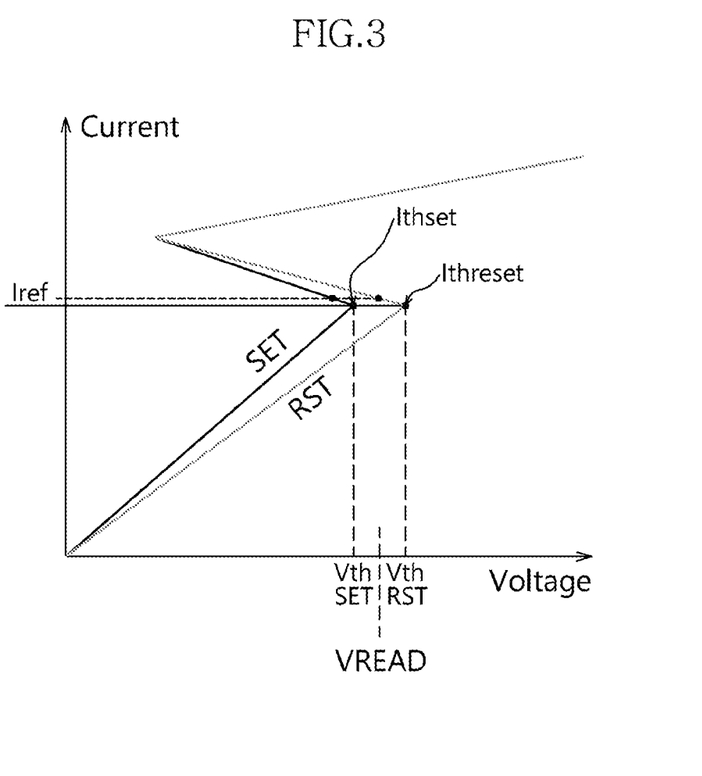
FIG. 3 is a graph illustrating a representation of an example of a set-reset current curve in accordance with voltages of a resistive memory device.

Referring to FIG. 3, the resistive memory device such as a phase-changeable memory device may have a snapback that a current may be sharply increased at a specific voltage. Thus, the first snapback detector 165 may measure the output current from the first reference cell 160. The first snapback detector 165 may detect the snapback current point where the output current from the first reference cell 160 may be sharply changed.

Figure 4:
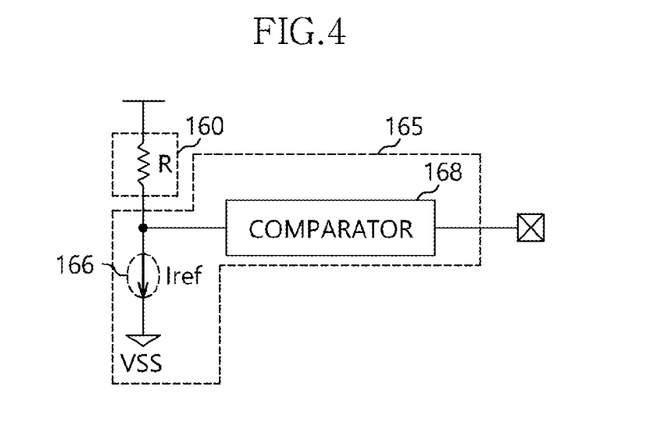
FIG. 4 is a circuit diagram illustrating a representation of an example of a snapback detector in accordance with an embodiment.

Referring to FIG. 4, the first snapback detector 165 may include a current source 166 and a comparator 168. The current source 166 may be electrically connected with the first reference cell 160 including a resistance R. The comparator 168 may be connected to a connection node between the first reference cell 160 and the current source 166 to detect and compare the output current from the first reference cell 160 and a reference current Iref from the current source 166. The reference current Iref from the current source 166 may be a random value in a sharply increasing section of the current in FIG. 3. The comparator 168 may include a sense amplifier having a latch circuit.

The first snapback detector 165 may set the snapback current point at which the output current may be sharply increased as a critical reset current Ithreset through the output current from the first reference cell 160 to detect a voltage corresponding to the critical reset current Ithreset.

Figure 5:
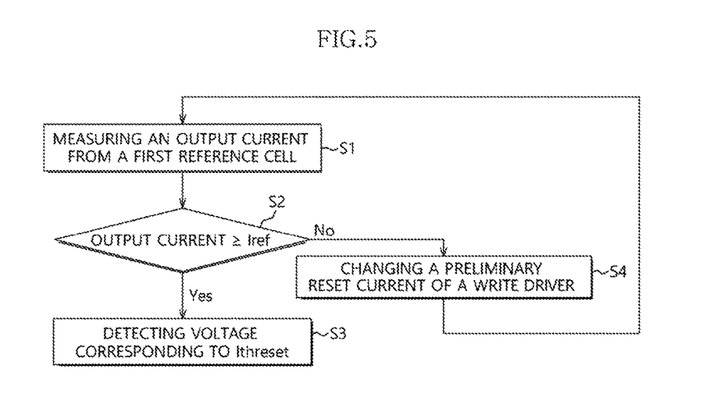
FIG. 5 is a flow chart illustrating a representation of an example of a method of detecting a critical reset current in accordance with an embodiment.

Referring to FIG. 5, in step S1, the first snapback detector 165 may measure the output current from the first reference cell 160.

In step S2, a measured output current may be compared with the reference current Iref of the first snapback detector 165. For example, determining whether the output current is greater than or equal to a reference current Iref.

In step S3, when the measured output current may be substantially the same as the reference current Iref, the first snapback detector 165 may set the output current as the critical reset current Ithreset to detect a voltage corresponding to the critical reset current Ithreset. In contrast, when the measured output current may be higher than the reference current Iref, the first snapback detector 165 may set a value between the output current and the reference current as the critical reset current Ithreset to detect a voltage corresponding to the critical reset current Ithreset.

In step S4, when the measured output current may be lower than the reference current Iref, the first snapback detector 165 may change the preliminary reset current Iwrite_RST from the write driver 155. The first snapback detector 165 may provide the first reference cell 160 with a changed preliminary reset current Iwrite_RST.

Referring to FIG. 2, the first reference cell 160 may set the voltage corresponding to the critical reset current Ithreset as a reference reset voltage information Vth_RST. The first reference cell 160 may provide the first ADC 170 with the reference reset voltage information Vth_RST and the test current Itest outputted from the first reference cell 160.

The first ADC 170 may be driven in response to an enabling signal from the control circuit 110. The first ADC 170 may convert the analog type reference reset voltage information Vth_RST into the digital code type data Data_R. The first ADC 170 may provide the control circuit 110 with the digital code type data Data_R.

Referring to FIG. 1, the set voltage-detecting circuit 200 may provide a reference cell with a preliminary set current corresponding to the preliminary target code P_CODE provided from the control circuit 110. The set voltage-detecting circuit 200 may detect an output current from the reference cell to which a write operation may be performed by the preliminary set current. The set voltage-detecting circuit 200 may detect a critical set current at which a snapback may not be generated. The set voltage-detecting circuit 200 may detect the reference set voltage information corresponding to the critical set current. The set voltage-detecting circuit 200 may provide the control circuit 110 with the reference set voltage information as the digital code data Data_S.

Figure 6:
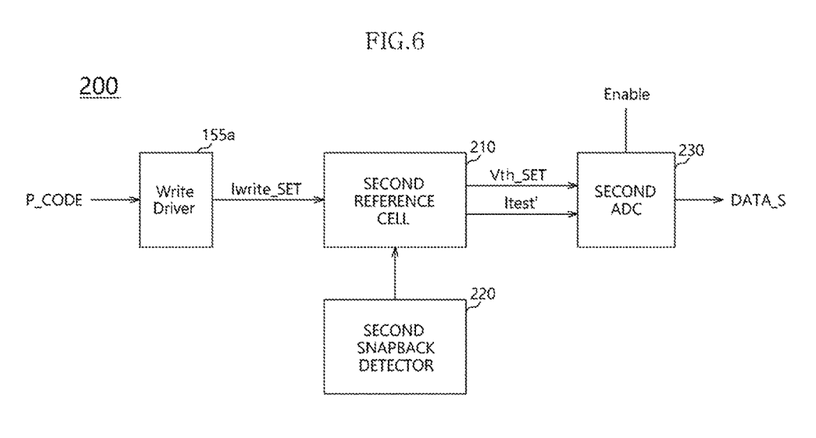
FIG. 6 is a block diagram illustrating a representation of an example of a set voltage-detecting circuit in accordance with an embodiment.

Referring to FIG. 6, the set voltage-detecting circuit 200 may include a write driver 155*a*, a second reference cell 210, a second snapback detector 220 and a second ADC 230.

The write driver 155*a* may generate a preliminary set current Iwrite_SET corresponding to the preliminary target code P_CODE provided from the control circuit 110. The write driver 155*a* may be shared with the reset voltage-detecting circuit 150 and the set voltage detecting circuit 200. The preliminary set current Iwrite_SET may be provided to the second reference cell 210. The write driver 155 may vary the preliminary set current Iwrite_SET until the second snapback detector 220 may detect a snapback current point. The write driver 155*a* may provide the second reference cell 210 with the variable preliminary set current Iwrite_SET. A variable range of the preliminary set current Iwrite_SET may be substantially the same as the variable range of the preliminary reset current Iwrite_RST.

The second reference cell 210 may have a structure substantially the same as that of the first reference cell 160. A resistance of the second reference cell 210 may receive the preliminary set current Iwrite_SET. A critical set voltage may be detected using a voltage on the resistance and an output current from the second reference cell 210, i.e., the test current Itest.

The second snapback detector 220 may have a structure substantially the same as that of the first snapback detector 165 in FIG. 4. A reference current Iref of a current source may be positioned on the snapback point of a set current curve SET in FIG. 3.

The second snapback detector 220 may set the snapback current point at which the output current from the second reference cell 210 may be sharply increased as a critical set current Ithset through the output current from the second reference cell 210 to detect a voltage corresponding to the critical set current Ithset.

Figure 7:
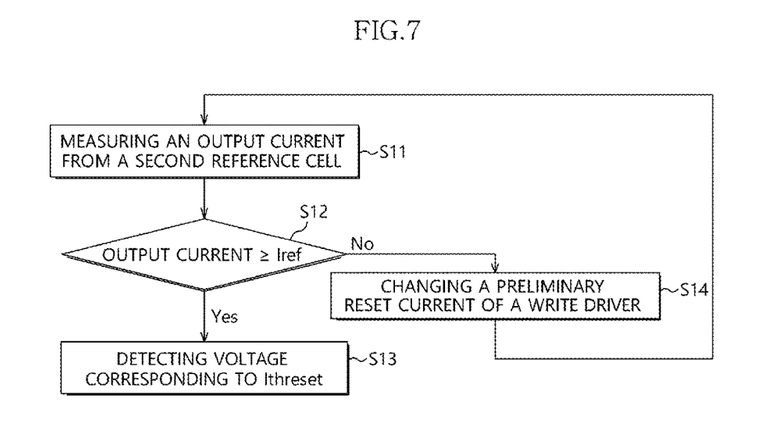
FIG. 7 is a flow chart illustrating a representation of an example of a method of detecting a critical set current in accordance with an embodiment.

Referring to FIG. 7, in step S11, the second snapback detector 220 may measure the output current from the second reference cell 210.

In step S12, a measured output current may be compared with the reference current Iref of the second snapback detector 220. For example, determining whether the output current is greater or equal to the reference current Iref.

In step S13, when the measured output current may be substantially the same as the reference current Iref, the second snapback detector 220 may set the output current as the critical set current Ithset to detect a voltage corresponding to the critical set current Ithset. In contrast, when the measured output current may be higher than the reference current Iref, the second snapback detector 220 may set a value between the output current and the reference current as the critical set current Ithset to detect a voltage corresponding to the critical set current Ithset.

In step S14, when the measured output current may be lower than the reference current Iref, the second snapback detector 220 may change the preliminary set current Iwrite_SET from the write driver 155. The second snapback detector 220 may provide the second reference cell 210 with a changed preliminary set current Iwrite_SET.

The second reference cell 210 may set the voltage corresponding to the critical set current Ithset as a reference set voltage information Vth_SET. The second reference cell 210 may provide the second ADC 230 with the reference set voltage information Vth_SET.

The second ADC 230 may be driven in response to an enabling signal from the control circuit 110. The second ADC 230 may convert the analog type reference set voltage information Vth_SET into the digital code type data Data_S. The second ADC 230 may provide the control circuit 110 with the digital code type data Data_S.

Figure 8:
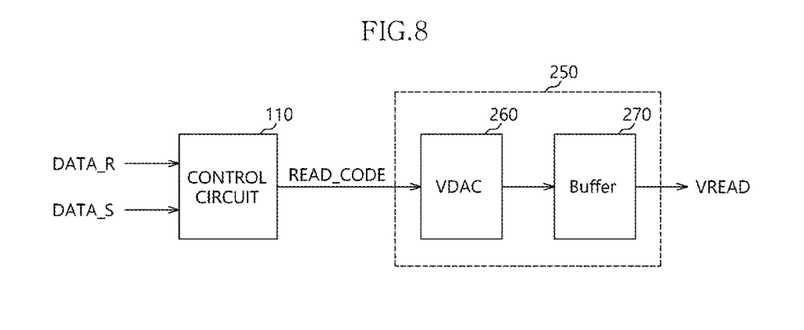
FIG. 8 is a circuit diagram illustrating a representation of an example of a read voltage-generating circuit in accordance with an embodiment.

As mentioned above, the control circuit 110 may receive the data code Data_R with respect to the reference reset voltage information Vth_RST from the reset voltage detecting circuit 150, and the data code Data_s with respect to the reference set voltage information Vth_SET from the set voltage-detecting circuit 200. As illustrated in FIG. 8, the control circuit 110 may determine a middle code between the data codes Data_R and Data_S as a read voltage code READ_CODE. The control circuit 110 may transmit the read voltage code READ_CODE to the read voltage-generating circuit 250.

The read voltage-generating circuit 250 may include a voltage digital analog converter (VDAC) 260 and a buffer 270. The VDAC 260 may receive the read voltage code READ_CODE. The VDAC 260 may convert the read voltage code READ_CODE into a voltage type. The converted voltage may be outputted as a read voltage Vread through the buffer 270.

According to examples of embodiments, the variable reset and set currents may be supplied to the reference cell having the environment and the structure substantially the same as those of the memory cell array to accurately detect the snapback current point. Thus, although a resistance distribution may be increased due to changes of the resistance, the set voltage and the reset voltage of the reference cell may be accurately detected using the accurate snapback current point. Further, the middle value between the set voltage (i.e., Vth SET) and the reset voltage (i.e., Vth RST) may be set as the read voltage so that the read voltage VREAD corresponding to the environment and states of the memory cell 280 (See FIG. 1) may be generated.

In examples of embodiments, the snapback current point may be detected using the code value in accordance with the temperatures of the predetermined code value. Alternatively, the read voltage may be determined by directly applying the voltage in place of the code value.

Figure 9:
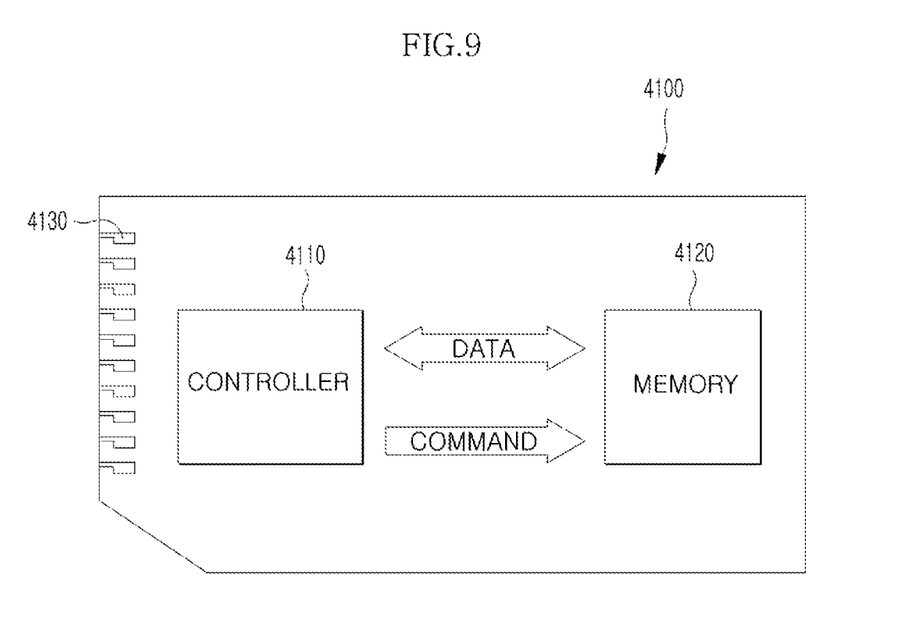
FIG. 9 is a schematic diagram illustrating a representation of an example of a memory card according to an embodiment of the present disclosure.

FIG. 9 is a schematic diagram illustrating a representation of an example of a memory card having a semiconductor integrated circuit device and/or resistive memory device according to various embodiments of the present disclosure.

Referring to FIG. 9, a memory card system 4100 including a controller 4110, a memory 4120, and an interface member 4130 may be provided. The controller 4110 and the memory 4120 may be configured to exchange a command and/or data. For example, the memory 4120 may be used to store a command to be executed by the controller 4110 and/or user data.

The memory card system 4100 may store data in the memory 4120 or output data from the memory 4120 to the outside. The memory 4120 may include the semiconductor integrated circuit device and/or resistive memory device according to any one of the above-described embodiments. The controller 4110 may transmit a test command to a probe test pad in an embodiment. Further, a non-contact test between the probe test pad and a probe card may be performed.

The interface member 4130 may function to input and output data from and to the outside. The memory card system 4100 may be a multimedia card (MMC), a secure digital card (SD) or a portable data storage device.

Figure 10:
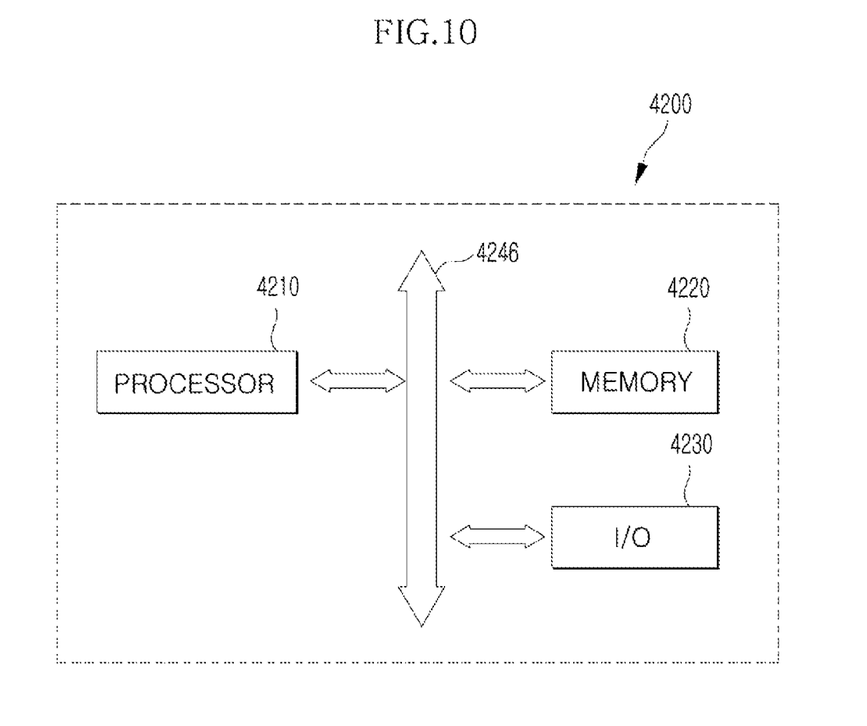
FIG. 10 is a block diagram illustrating a representation of an example of an electronic system according to an embodiment of the present disclosure.

FIG. 10 is a block diagram illustrating a representation of an example of an electronic apparatus having a semiconductor integrated circuit device and/or resistive memory device according to various embodiments of the disclosure.

Referring to FIG. 10, an electronic apparatus 4200 including a processor 4210, a memory 4220, and an input/output (I/O) device 4230 may be provided. The processor 4210, the memory 4220, and the I/O device 4230 may be electrically coupled through a bus 4246.

The memory 4220 may receive a control signal from the processor 4210. The memory 4220 may store a code and data for operation of the processor 4210. The memory 4220 may be used to store data to be accessed through the bus 4246.

The memory 4220 may include the semiconductor integrated circuit device and/or resistive memory device according to any one of the above-described embodiments. In order for detailed realization and modification, additional circuits and control signals may be provided.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving wireless information.

Descriptions will be made below for the realization and modified examples of the electronic apparatus 4200, with reference to FIGS. 11 and 12.

Figure 11:
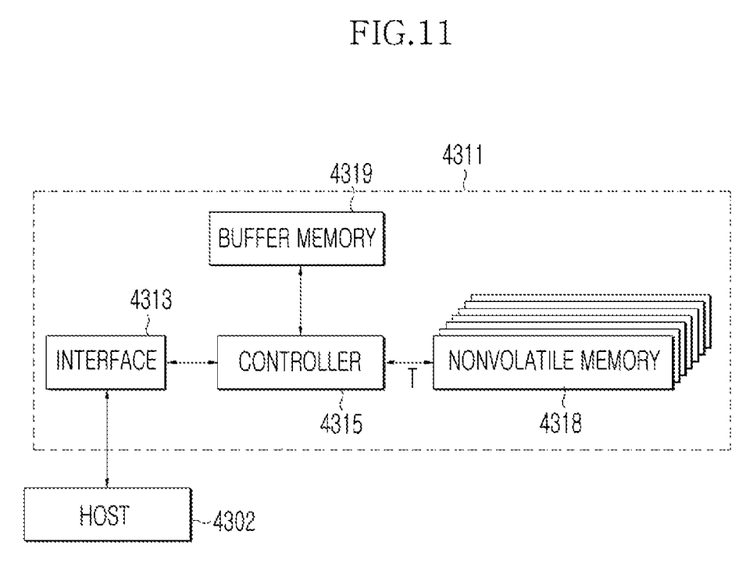
FIG. 11 is a block diagram illustrating a representation of an example of a data storage apparatus according to an embodiment of the present disclosure.

FIG. 11 is a block diagram illustrating a representation of an example data storage apparatus having a semiconductor integrated circuit device and/or resistive memory device according to various embodiments of the disclosure.

Referring to FIG. 11, a data storage apparatus 4311 such as a solid state disk (SSD) may be provided. The SSD 4311 may include an interface 4313, a controller 4315, a nonvolatile memory 4318, and a buffer memory 4319.

The SSD 4311 may be an apparatus which stores information using a semiconductor device. The SSD 4311 may be faster, may have a lower mechanical delay or failure rate. The SSD 4311 may also generate less heat and noise than a hard disk drive (HDD). Further, the SSD 4311 may be smaller and lighter than the HDD. The SSD 4311 may be widely used in a laptop PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315 and may be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302. The interface 4313 may also function to transmit and receive electrical signals such as data to and from the host 4302. For example, the interface 4313 may be a device which uses the same standard as SATA, IDE, SCSI, and/or a combination thereof. The nonvolatile memory 4318 may be electrically coupled to the interface 4313 via the controller 4315.

The nonvolatile memory 4318 may function to store data received through the interface 4313.

The nonvolatile memory 4318 may include the semiconductor integrated circuit device and/or resistive memory device according to any one of the above-described embodiments. The nonvolatile memory 4318 has a characteristic that stored data is retained even when power supply to the SSD 4311 is interrupted.

The buffer memory 4319 may include a volatile memory. The volatile memory may be a DRAM and/or an SRAM. The buffer memory 4319 has a relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315. Further, data may then be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may function to increase the effective operation speed of the SSD 4311 and reduce an error occurrence rate.

Figure 12:
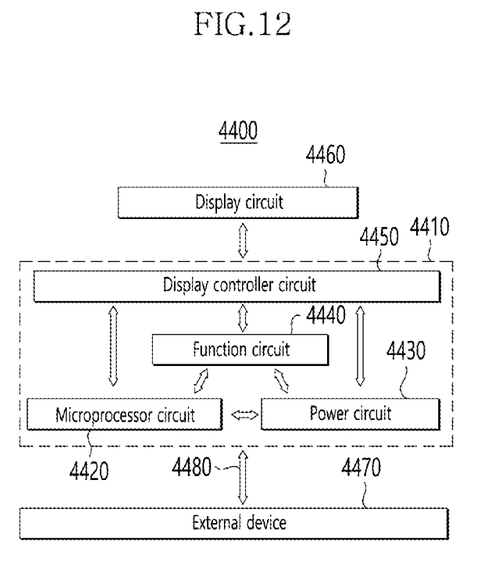
FIG. 12 is a block diagram illustrating a representation of an example of an electronic apparatus according to an embodiment of the present disclosure.

FIG. 12 is a system block diagram illustrating a representation of an example of an electronic apparatus having a semiconductor integrated circuit device and/or resistive memory device according to various embodiments of the disclosure.

Referring to FIG. 12, an electronic system 4400 including a body 4410, a microprocessor circuit 4420, a power circuit 4430, a function circuit 4440, and a display controller circuit 4450 may be provided.

The body 4410 may be a mother board formed of a printed circuit board (PCB). The microprocessor circuit 4420, the power circuit 4430, the function circuit 4440, and the display controller circuit 4450 may be mounted on the body 4410. A display 4460 may be disposed inside the body 4410 or outside the body 4410. For example, the display 4460 may be disposed on a surface of the body 4410. The display 4460 may also display images processed by the display controller circuit 4450.

The power circuit 4430 may function to receive a voltage from an external battery or the like, divide the voltage into desired voltage levels, and supply divided voltages to the microprocessor circuit 4420, the function circuit 4440, the display controller circuit 4450, and so forth. The microprocessor circuit 4420 may receive a voltage from the power circuit 4430 and control the function circuit 4440 and the display 4460. The function circuit 4440 may perform various functions of the electronic system 4400. For example, when the electronic system 4400 is a portable phone, the function circuit 4440 may include various components capable of performing portable phone functions, such as output of an image to the display 4460 or output of a voice to a speaker, by dialing or communication with an external device 4470. When a camera is mounted on the body 4410, the function circuit 4440 may serve as a camera image processor.

When the electronic system 4400 is electrically coupled to a memory card or the like to increase capacity, the function circuit 4440 may be a memory card controller. The function circuit 4440 may exchange signals with the external device 4470 through a wired or wireless communication circuit 4480. When the electronic system 4400 needs a universal serial bus (USB) or the like to expand functions, the function circuit 4440 may serve as an interface controller. Any one semiconductor integrated circuit device and/or resistive memory device among the semiconductor integrated circuit devices and/or resistive memory devices according to the above-described embodiments may be applied to at least any one of the microprocessor circuit 4420 and the function circuit 4440.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A resistive memory device comprising:
    a reset voltage-detecting circuit configured to receive a variable preliminary reset current and detect a reference reset voltage information corresponding to an internal environment of a first reference cell, the reset voltage-detecting circuit including a first snapback detector configured to measure an output current from the first reference cell and detect a snapback current point at which the output current from the first reference cell corresponds to a critical reset current;
    a set voltage-detecting circuit configured to receive a variable preliminary set current and detect a reference set voltage information corresponding to an internal environment of a second reference cell;
    a control circuit configured to receive the reference reset voltage information and the reference set voltage information and determine a middle voltage information between the reference reset voltage information and the reference set voltage information; and
    a read voltage-generating circuit configured to receive the middle voltage information and generate a read voltage.

2. The resistive memory device of claim 1, wherein the reset voltage-detecting circuit comprises:
    a write driver configured to generate the preliminary reset current corresponding to an initially determined reset voltage from the control circuit; and
    the first reference cell having an environment substantially the same as that of a memory cell array and configured to receive the preliminary reset current;
    wherein the write driver is configured to change and output the preliminary reset current in accordance with detection results of the first snapback detector.

3. The resistive memory device of claim 2, further comprising a temperature sensor configured to determine the initially determined reset voltage.

4. The resistive memory device of claim 1, wherein the first snapback detector comprises:
    a current source connected with the first reference cell and configured to provide a first reference current; and
    a comparator connected to a connection node between the current source and the first reference cell and configured to compare the first reference current with the output current from the first reference cell.

5. The resistive memory device of claim 2, wherein the reset voltage-detecting circuit further comprises a first analog digital converter (ADC) configured to convert a voltage with respect to the snapback current point detected by the first snapback detector into a digital code.

6. The resistive memory device of claim 5, wherein the first ADC is driven based on an enabling signal provided from the control circuit.

7. The resistive memory device of claim 1, wherein the set voltage-detecting circuit comprises:
    a write driver configured to generate the preliminary set current corresponding to an initially determined set voltage from the control circuit;
    the second reference cell having an environment substantially the same as that of a memory cell array and configured to receive data by the preliminary set current; and
    a second snapback detector configured to measure an output current from the second reference cell and detect a snapback current point at which the output current from the second reference cell is sharply changed, wherein the write driver is configured to change and output the preliminary set current in accordance with detection results of the second snapback detector.

8. The resistive memory device of claim 7, further comprising a temperature sensor configured to determine the initially determined set voltage.

9. The resistive memory device of claim 7, wherein the second snapback detector comprises:
- a current source connected with the second reference cell and configured to provide a second reference current; and
- a comparator connected to a connection node between the current source and the second reference cell and configured to compare the second reference current with the output current from the second reference cell.

10. The resistive memory device of claim 7, wherein the set voltage-detecting circuit further comprises a second analog digital converter (ADC) configured to convert a voltage with respect to the snapback current point detected by the second snapback detector into a digital code.

11. The resistive memory device of claim 7, wherein a second analog digital converter (ADC) is driven based on an enabling signal provided from the control circuit.

12. The resistive memory device of claim 1, wherein the read voltage-generating circuit comprises:
- a voltage digital analog converter (VDAC) configured to receive the middle voltage information and convert the middle voltage information into a voltage type; and
- a buffer configured to buffer an output result from the VDAC and generate the read voltage.

13. A method of detecting a snapback current point of a reference cell for generating a read voltage, the method comprising:
- receiving, with a reset voltage-detecting circuit, a variable preliminary reset current and detecting a reference reset voltage information corresponding to a snapback current point of a first reference cell;
- receiving, with a set voltage-detecting circuit, a variable preliminary set current and detecting a reference set voltage information corresponding to a snapback current point of a second reference cell;
- receiving, with a control circuit, the reference reset voltage information and the reference set voltage information and determining a middle voltage information between the reference reset voltage information and the reference set voltage information; and
- receiving, with a read voltage-generating circuit, the middle voltage information to generate the read voltage.

* * * * *